(12) United States Patent
Heo et al.

(10) Patent No.: US 10,573,401 B2
(45) Date of Patent: Feb. 25, 2020

(54) MEMORY DEVICES AND MEMORY PACKAGES

(71) Applicant: Samsung Electronics Co., Ltd., Suwon-si, Gyeonggi-do (KR)

(72) Inventors: Jin Seok Heo, Yongin-si (KR); Jung Hwan Choi, Hwaseong-si (KR); Wang Soo Kim, Seoul (KR); Yoo Chang Sung, Hwaseong-si (KR); Jun Ha Lee, Seoul (KR); Ju Ho Jeon, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 16/030,125

(22) Filed: Jul. 9, 2018

(65) Prior Publication Data

US 2019/0228832 A1     Jul. 25, 2019

(30) Foreign Application Priority Data

Jan. 19, 2018  (KR) .......................... 10-2018-0007001

(51) Int. Cl.
*G11C 29/36*  (2006.01)
*G11C 29/26*  (2006.01)
(Continued)

(52) U.S. Cl.
CPC .......... *G11C 29/36* (2013.01); *G11C 11/4087* (2013.01); *G11C 11/4093* (2013.01);
(Continued)

(58) Field of Classification Search
CPC . G11C 29/36; G11C 11/4087; G11C 11/4093; G11C 29/1201; G11C 29/26;
(Continued)

(56) References Cited

U.S. PATENT DOCUMENTS 5,862,094 A * 1/1999 Kawabata .............. G11C 29/14
                                                        365/222
6,222,781 B1 * 4/2001 Matsumoto .............. G11C 5/14
                                                        365/189.09
(Continued)

FOREIGN PATENT DOCUMENTS

JP          10-261948         9/1998
KR       20170100720 A        9/2017

*Primary Examiner* — Kyle Vallecillo
(74) *Attorney, Agent, or Firm* — Harness, Dickey & Pierce, P.L.C.

(57) ABSTRACT

A memory device includes a plurality of receivers that each include a first input terminal coupled to one pin of a plurality of input/output pins. The memory devices further includes a transmitter having an output terminal coupled to the first input terminals of the plurality of receivers. The memory device further includes a control circuit configured to control the transmitter to output a particular test signal. The plurality of receivers are each configured to generate output data based on receiving the particular test signal from the transmitter. The control circuit is further configured to adjust the plurality of receivers based on the output data generated by the plurality of receivers and received at the control circuit from the plurality of receivers.

20 Claims, 13 Drawing Sheets

(51) Int. Cl.
    *G11C 11/408* (2006.01)
    *G11C 29/12* (2006.01)
    *G11C 11/4093* (2006.01)
    *G11C 29/38* (2006.01)
    *G11C 29/18* (2006.01)
    *H01L 25/065* (2006.01)

(52) U.S. Cl.
    CPC .......... *G11C 29/1201* (2013.01); *G11C 29/26* (2013.01); *G11C 29/38* (2013.01); *G11C 2029/1802* (2013.01); *H01L 25/0657* (2013.01); *H01L 2225/0651* (2013.01); *H01L 2225/06565* (2013.01); *H01L 2225/06586* (2013.01)

(58) Field of Classification Search
    CPC ............ G11C 29/38; G11C 2029/1802; H01L 25/0657; H01L 2225/0651; H01L 2225/06565; H01L 2225/06586
    See application file for complete search history.

(56) References Cited

U.S. PATENT DOCUMENTS

| | | | |
|---|---|---|---|
| 8,631,268 B2 | 1/2014 | Park | |
| 8,644,096 B2 | 2/2014 | Bringivijayaraghavan | |
| 9,043,539 B2 | 5/2015 | Kaiwa et al. | |
| 9,218,575 B2 | 12/2015 | Mozak et al. | |
| 9,563,213 B2 | 2/2017 | Addepalli et al. | |
| 9,647,659 B1 | 5/2017 | Ahn et al. | |
| 9,665,462 B2 | 5/2017 | Tatapudi et al. | |
| 2004/0044808 A1 | 3/2004 | Salmon et al. | |
| 2004/0130469 A1 | 7/2004 | Casper | |
| 2004/0153924 A1* | 8/2004 | Shinagawa | G11C 29/1201 714/724 |
| 2005/0108607 A1* | 5/2005 | Chae | G11C 29/36 714/738 |
| 2007/0255983 A1* | 11/2007 | Funaba | G11C 5/04 714/724 |
| 2008/0313510 A1* | 12/2008 | Baker | G11C 11/5678 714/718 |
| 2011/0187408 A1 | 8/2011 | Byeon et al. | |
| 2013/0038380 A1 | 2/2013 | Cordero et al. | |
| 2013/0215696 A1* | 8/2013 | Choi | G11C 29/04 365/201 |
| 2014/0157065 A1* | 6/2014 | Ong | G11C 29/12 714/718 |
| 2015/0153750 A1 | 6/2015 | Jeon | |
| 2017/0123446 A1 | 5/2017 | Siddula et al. | |
| 2019/0198099 A1* | 6/2019 | Mirichigni | G11C 13/004 |

* cited by examiner

MEMORY DEVICES AND MEMORY PACKAGES

CROSS-REFERENCE TO RELATED APPLICATION

This application claims benefit of priority, under 35 U.S.C. § 119, to Korean Patent Application No. 10-2018-0007001 filed on Jan. 19, 2018 in the Korean Intellectual Property Office, the disclosure of which is incorporated herein by reference in its entirety.

BACKGROUND

1. Field

The present inventive concepts relates to memory devices and to memory packages.

2. Description of Related Art

Memory devices, which store and output data, may be applied to various fields. In recent years, memory devices have tended to be extensively applied to home appliances, Internet of things (IoT) devices, automobiles, medical devices, and the like, as well as to computer devices to which memory devices have generally been applied (e.g., included). Therefore, it is very important to improve productivity in the production of memory devices. Memory devices may be manufactured through a manufacturing process, a test process of verifying manufactured memory devices, and the like. In particular, during the test process, a plurality of receivers included in memory devices may be adjusted to ensure optimal input/output characteristics.

SUMMARY

Some example embodiments of the present inventive concepts provide a memory device capable of adjusting a plurality of receivers by the memory device itself, without interworking with a host, thereby improving operating performance and/or efficiency (e.g., functionality) of the memory device and/or an electronic device (e.g., computing device) in which the memory device is included.

According some example embodiments of the present inventive concepts, a memory device may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a plurality of receivers, each receiver of the plurality of receivers includes a first input terminal coupled to one pin of a plurality of input/output pins. The memory device may include a transmitter having an output terminal coupled to the first input terminals of the plurality of receivers. The memory device may include a control circuit configured to control the transmitter to output a particular test signal. The plurality of receivers may be each configured to generate output data based on receiving the particular test signal from the transmitter. The control circuit may be further configured to adjust the plurality of receivers based on the output data generated by the plurality of receivers and received at the control circuit from the plurality of receivers.

According to some example embodiments of the present inventive concepts, a memory device may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a transmitter configured to output a particular test signal, a receiver including a first input terminal coupled to an input/output pin and an output terminal of the transmitter and a second input terminal configured to receive a reference voltage, wherein the receiver is configured to generate output data based on the particular test signal received through the first input terminal, and a control circuit configured to regulate an offset of the receiver based on the output data.

According to some example embodiments of the present inventive concepts, a memory package may include a package substrate having a plurality of input/output pins and a plurality of memory devices on the package substrate. The plurality of memory devices may be configured to share the plurality of input/output pins. Each memory device of the plurality of memory devices may include a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor, a plurality of receivers coupled to the plurality of input/output pins, a transmitter configured to output a particular test signal to at least one receiver of the plurality of receivers, and a control circuit configured to regulate a parameter of the at least one receiver, based on output data generated by the at least one receiver at the control circuit, the output data generated by the at least one receiver based on the at least one receiver having received the test signal.

BRIEF DESCRIPTION OF DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION

Hereinafter, some example embodiments of the present inventive concepts will be described with reference to the accompanying drawings.

Figure 1:
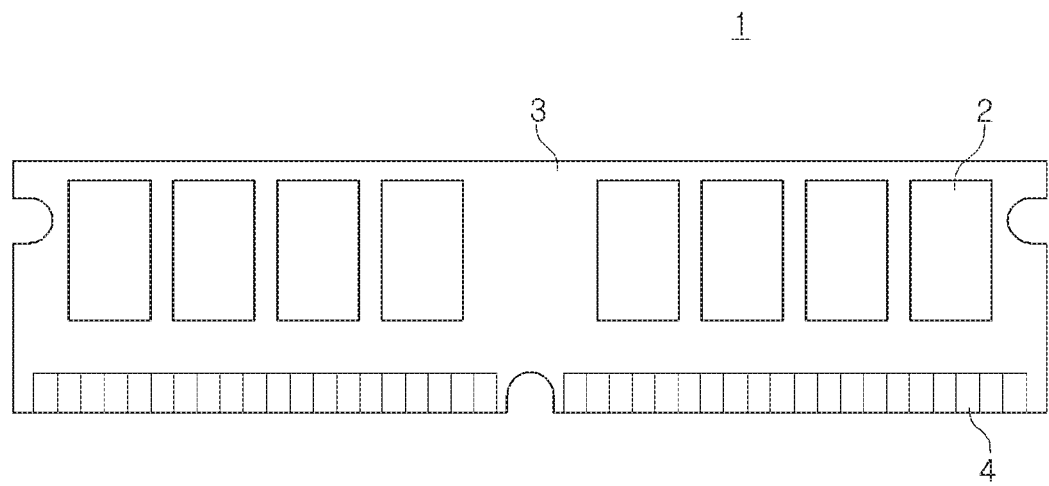
FIGS. 1 and 2 are views schematically illustrating a memory package according to some example embodiments of the inventive concepts.
Figure 2:
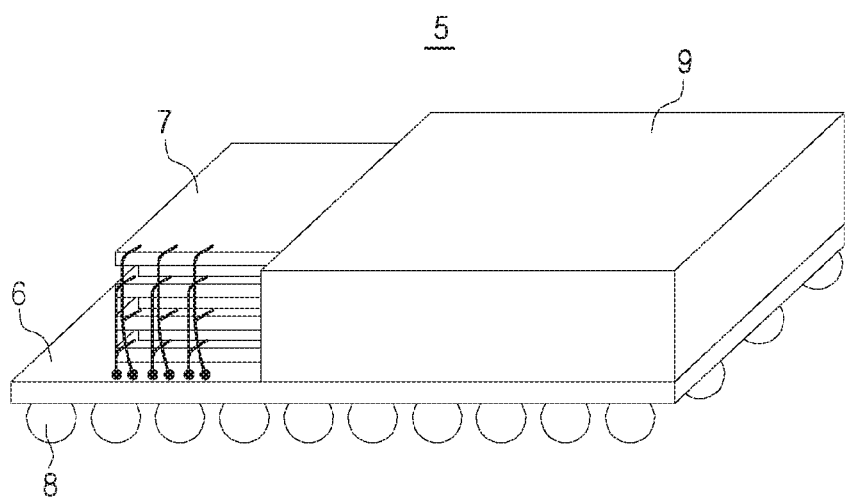

FIGS. 1 and 2 are views schematically illustrating a memory package according to some example embodiments of the inventive concepts.

Referring first to FIG. 1, a memory package 1 according to some example embodiments of the inventive concepts includes a plurality of memory devices 2, a package substrate 3 (also referred to herein as a "package board") on which the plurality of memory devices 2 are mounted, and the like. Input/output pins 4 for transmitting/receiving data may be provided at one end of the package substrate 3. The plurality of memory devices 2 may receive data through the input/output pins 4 and store the received data, or output data through the input/output pins 4. Although it is illustrated in FIG. 1 that a single memory package 1 includes eight memory devices 2, the amount of memory devices 2 may be varied according to data storage capacity that the memory package 1 is intended to provide, data storage capacity of each of the memory devices 2, and the like. An input/output bus connecting the memory devices 2 and the input/output pins 4 may be provided in the package substrate 3, and at least some of the memory devices 2 may commonly use the input/output bus.

Referring to FIG. 2, a memory package 5 according to some example embodiments of the inventive concepts may include a package substrate 6, a plurality of memory devices 7 laminated on the package substrate 6, solder bumps 8 provided on a lower surface of the package substrate 6, an encapsulant 9, and the like. In some example embodiments, including the example embodiments illustrated in FIG. 2, the memory devices 7 may be laminated on the package substrate 6 in a vertical direction. The memory devices 7 may be connected to the solder bumps 8 through wires, through silicon vias (TSVs), or the like, and at least some of the memory devices 7 may commonly use the solder bumps 8. The memory devices 7 shown in FIG. 2 will be understood to be "stacked" on the package substrate 6, as the memory devices 7 vertically overlap each other on the package substrate 6 (e.g., overlap each other in a direction that extends perpendicularly to a memory device-proximate surface of the package substrate 6). The memory devices 7 that are stacked on the package substrate 6 may also be referred to herein as a "stack" of memory devices 7 on the package substrate 6.

Figure 3:
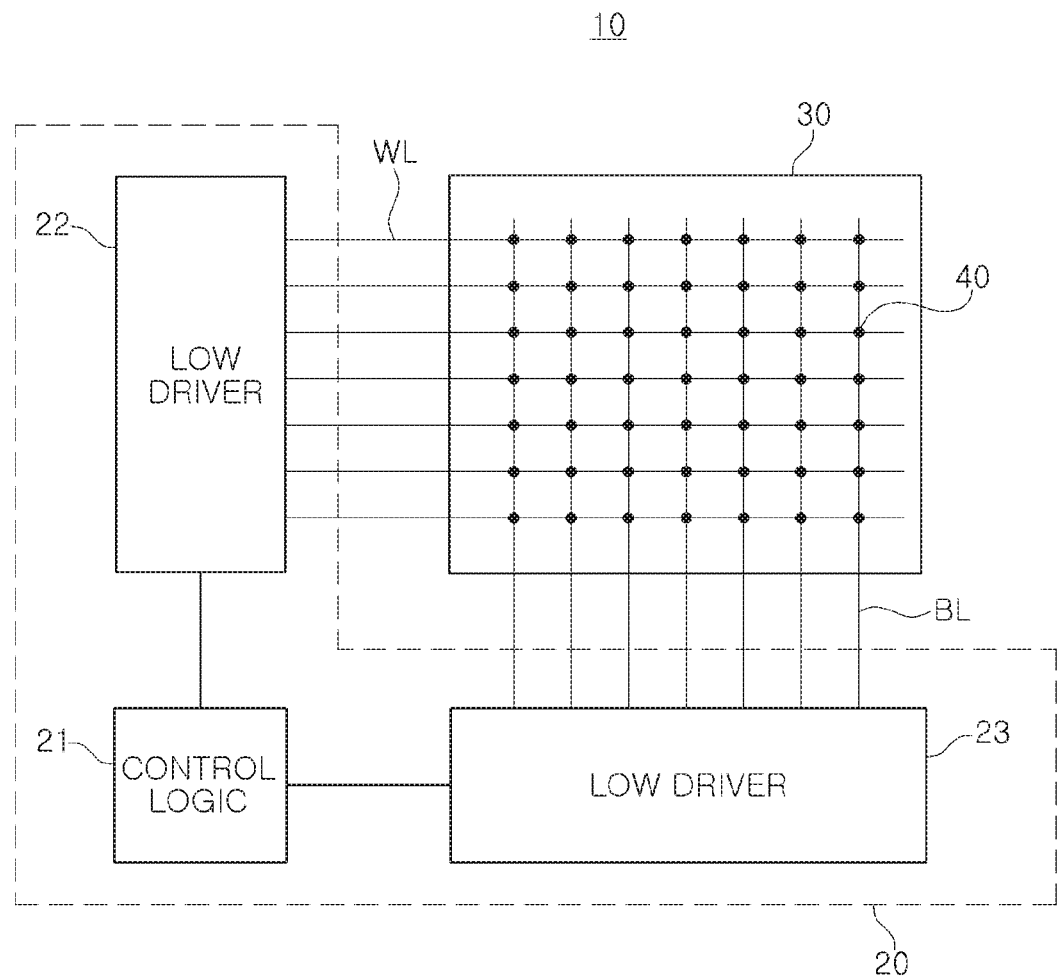
FIG. 3 is a block diagram schematically illustrating a memory device according to some example embodiments of the inventive concepts.

FIG. 3 is a block diagram illustrating a memory device according to some example embodiments of the inventive concepts.

A memory device 10 according to some example embodiments of the inventive concepts illustrated in FIG. 3 may be employed as the plurality of memory devices 2 included in the memory package 1 according to the example embodiments illustrated in FIGS. 1 and 2. Referring to FIG. 3, the memory device 10 according to some example embodiments of the inventive concepts may include a memory controller 20 and a bank array 30. In some example embodiments of the inventive concepts, the memory controller 20 may include a control logic 21 (also referred to herein as a "control circuit"), a row driver 22 (also referred to herein as a "row driver circuit"), a column driver 23 (also referred to herein as a "column driver circuit"), and the like, and the bank array 30 may include a plurality of memory cells 40. It will be understood that the control logic 21, the row driver 22, and the column driver 23 as shown in at least FIG. 3, refer to the known instances of circuitry that are commonly known as "control logic," "row driver," and "column driver," respectively, in the field of semiconductor memory devices, including dynamic random-access memory (DRAM).

In some example embodiments of the inventive concepts, the row driver 22 may be connected to memory cells 40 via word lines WL and the column driver 23 may be connected to the memory cells 40 via bit lines BL may be connected. In some example embodiments of the inventive concepts, the row driver 22 may include an address decoder for selecting a memory cell to which data is to be written or from which data is to be read, and the column driver 23 may include a sense amplifier and a column decoder to which data is to be written to the memory cell or from which data is to be read from the memory cells MC. Operations of the row driver 22 and the column driver 23 may be controlled by the control logic 21.

Figure 4:
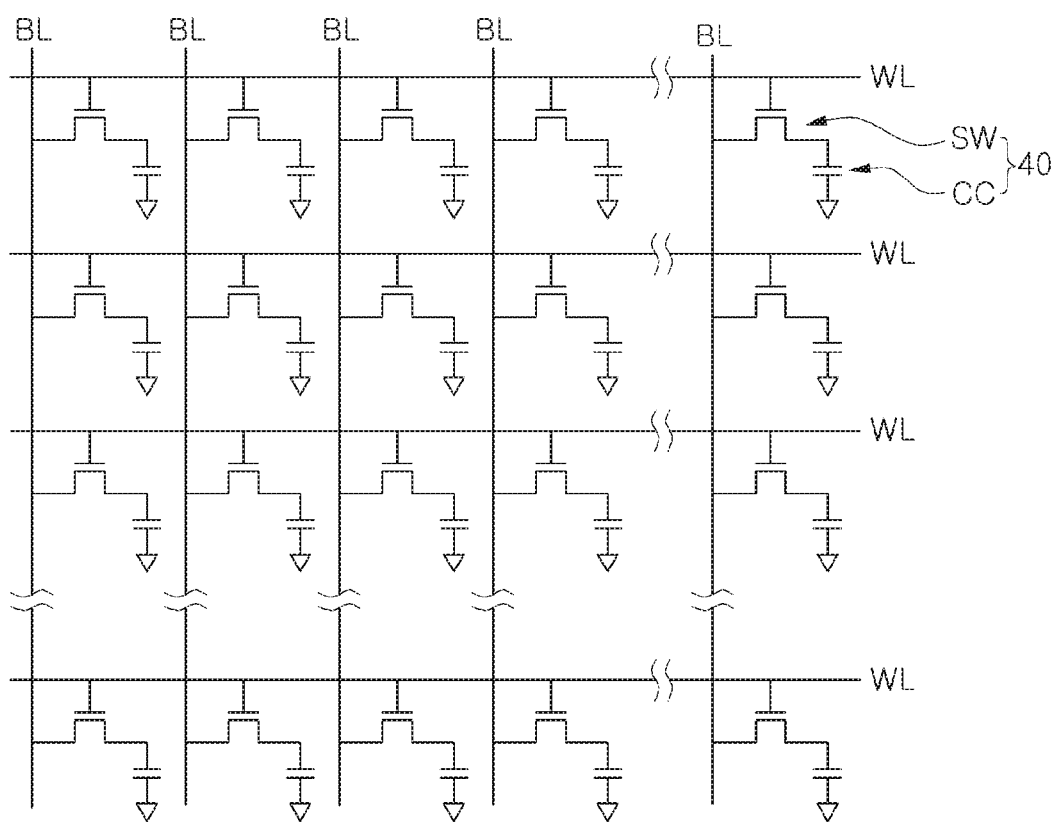
FIG. 4 is a view illustrating a bank array included in a memory device according to some example embodiments of the inventive concepts.

FIG. 4 illustrates a bank array included in a memory device according to some example embodiments of the inventive concepts.

Referring to FIG. 4, the bank array 30 according to some example embodiments of the inventive concepts may include a plurality of memory cells 40. The memory cells 40 may be provided at points at which a plurality of word lines WL and a plurality of bit lines BL intersect with each other. That is, each of the memory cells 40 may be connected to one word line WL and one bit line BL.

Each of the memory cells 40 may include a switching element SW and an information storage capacitor CC. In some example embodiments of the inventive concepts, the switching element SW may include a transistor, and a gate terminal of the transistor may be connected to the word line WL and drain and source terminals of the transistor may be connected to the bit line BL and the information storage capacitor CC, respectively.

The memory controller 20 may write or erase data by charging the information storage capacitor CC included in each of the plurality of memory cells 40 with charges or discharging charges charged in the information storage capacitor (CC) through the plurality of word lines WL and the plurality of bit lines BL. In some example embodiments, the memory controller 20 may read data from each of the plurality of memory cells 40 by reading a voltage, or the like, of the information storage capacitor CC. In some example embodiments of the inventive concepts, the memory controller 20 may perform a refresh operation to rewrite data to the plurality of memory cells 40 so that data may not be lost as the charges charged in the information storage capacitor CC are naturally discharged.

Figure 5:
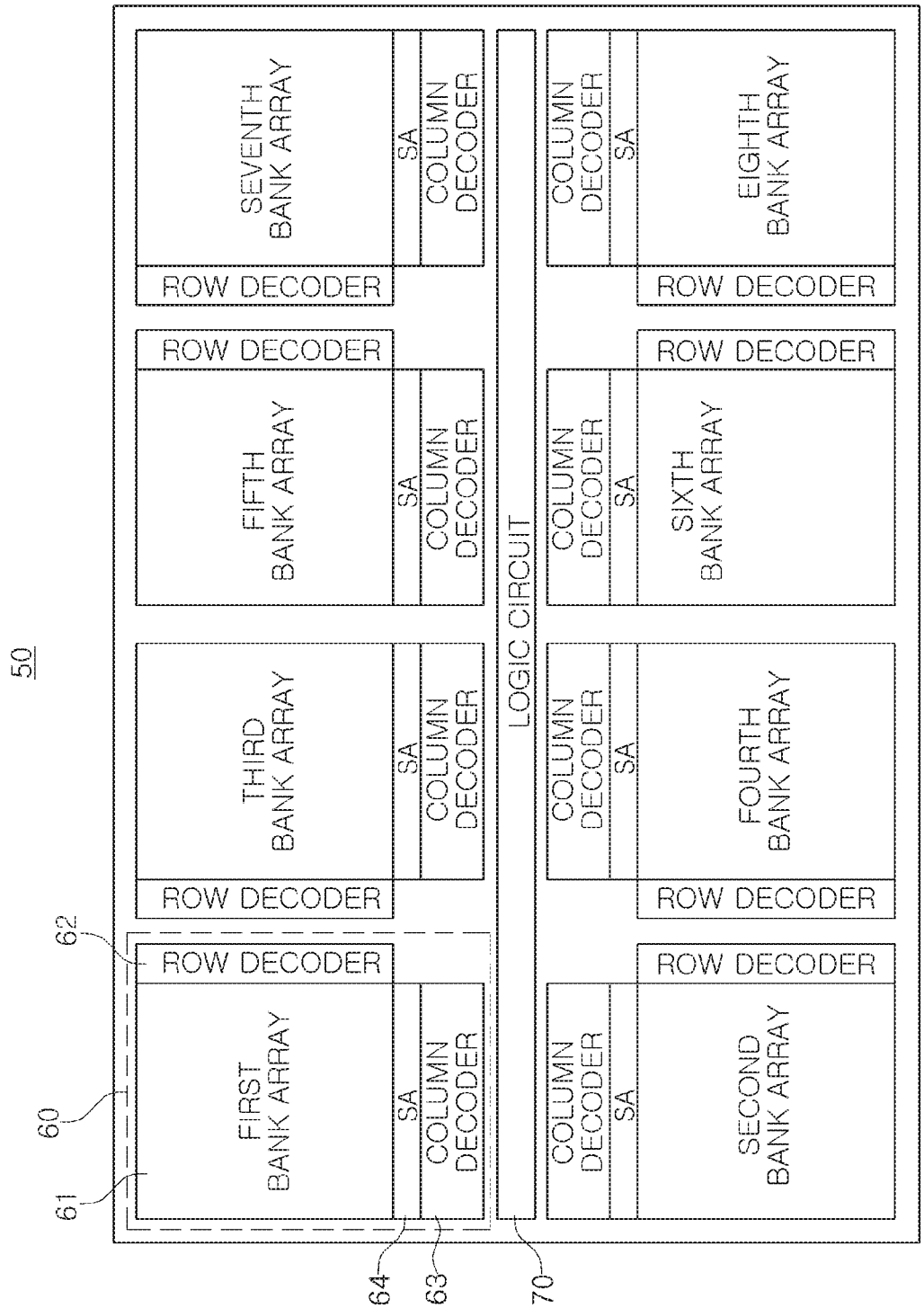
FIG. 5 is a simplified view illustrating a structure of a memory device according to some example embodiments of the inventive concepts.

FIG. 5 is a view schematically illustrating a structure of a memory device according to some example embodiments of the inventive concepts.

Referring to FIG. 5, a memory device 50 according to some example embodiments of the inventive concepts may include a memory bank 60 and a logic circuit 70. The memory bank 60 may include a bank array 61 having a plurality of memory cells, a row decoder 62, a column decoder 63, and a sense amplifier (SA) 64. In some example embodiments of the inventive concepts, the memory device 50 may include a plurality of memory banks 60.

The plurality of memory banks 60 included in the memory device 50 may commonly use one logic circuit 70. The logic circuit 70 may read data from the bank array 61, store data in the bank array 61, or delete data stored in the bank array 61. The logic circuit 70 may include a control logic for controlling the row decoder 62, the column decoder 63, the sense amplifier 64, and the like, together with a receiver and a transmitter connected to input/output pins for transmitting and receiving data.

Figure 6:
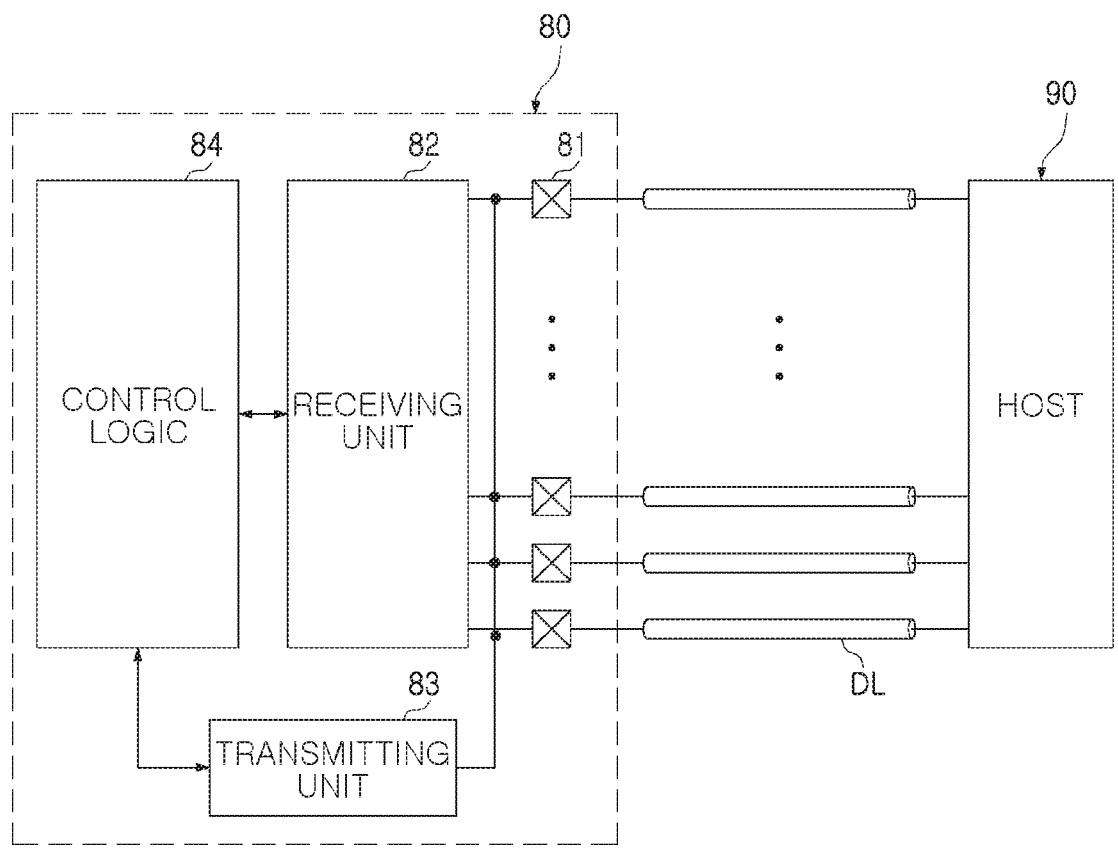
FIG. 6 is a view illustrating a comparative example for explaining an operation of a memory device according to some example embodiments of the inventive concepts.

FIG. 6 is a view illustrating a comparative example for explaining an operation of a memory device according to some example embodiments of the inventive concepts.

Referring to FIG. 6, a memory device 80 according to some example embodiments of the inventive concepts may communicate with a host 90 via data lanes DL. The data lanes DL may be connected to a receiving unit 82 and a transmitting unit 83 through a plurality of input/output pins 81. Operations of the receiving unit 82 (also referred to herein as a receiving circuit) and the transmitting unit 83 (also referred to herein as a transmitting circuit) may be controlled by the control logic 84 (also referred to herein as a control circuit).

The receiving unit 82 may include a plurality of receivers, and the transmitting unit 83 may include at least one transmitter. For example, the plurality of receivers included in the receiving unit 82 and the transmitter included in the transmitting unit 83 may commonly use the plurality of input/output pins 81. In some example embodiments of the inventive concepts, each of the plurality of receivers may be implemented as a differential amplifier circuit, and may compare a signal received through the input/output pins 81 with a particular (or, alternatively, predetermined) reference voltage and send out output data. Restated, the plurality of receivers may be synchronized with a clock signal to generate the output data based on comparing the test signal with the reference voltage.

The plurality of receivers may be manufactured through the same (e.g., a common) process. However, due to variations, characteristics of at least a portion of the plurality of receivers may be different. Thus, even in the case that the same signal is input to the plurality of receivers through the plurality of data lanes DL, margins of the plurality of receivers may be different from each other. In some example embodiments of the inventive concepts, eye margins representing characteristics of the signal received by the plurality of receivers through the data lanes DL may vary depending on variations of processes of manufacturing the receivers, which may negatively affect performance of the memory device 80.

In some example embodiments of the inventive concepts, in order to minimize variations among the plurality of receivers, the memory device 80 may adjust the plurality of receivers during a test process. In some example embodiments of the inventive concepts, the control logic 84 may adjust the receivers by (e.g., based on) regulating at least one of an offset of each of the receivers, a voltage gain of each of the receivers, a supply voltage of each of the receivers, or a reference voltage input to each of the receivers, and so on. Restated, as described herein, "adjusting" a receiver may include adjusting at least one "parameter" of the receiver, where a "parameter" of the receiver may include at least one of an offset of the receiver, a voltage gain of the receiver, a supply voltage of the receiver, a reference voltage input to the receiver, some combination thereof, or the like. Accordingly, "adjusting" a receiver, "regulating" a receiver, "adjusting" at least one parameter of a receiver, and "regulating" at least one parameter of the receiver may be referred to interchangeably herein.

In general, the memory device 80 and the host 90 may be connected by the plurality of input/output pins 81 to reduce variations among the plurality of receivers. The host 90 may generate a test signal on the basis of particular (or, alternatively, predetermined) test data and transmit the test signal to the memory device 80 through the data lanes DL. The control logic 84 may compare output data generated by the plurality of receivers after receiving the test signal, with the test data. The control logic 84 may adjust at least one receiver of the plurality of receivers on the basis of a result of comparing the test data and the output data.

As described above with reference to FIGS. 1 and 2, the memory package may include a plurality of memory devices 80. Thus, in case in which the receivers are adjusted using the test signal transmitted from the host 90, the other memory devices included in the memory package cannot adjust the receivers, while the host 90 and the memory device 80 are communicating with each other, and thus, it may take a long time to adjust the receivers of all the memory devices included in the memory package.

In some example embodiments of the inventive concepts, the memory device 80 itself may adjust the receivers. The transmitting unit 83 may output a test signal using test data written during a manufacturing process of the memory device 80 and the plurality of receivers included in the receiving unit 82 may receive the test signal and send out output data to the control logic 84. The control logic 84 may compare the output data generated by the plurality of receivers with the test data to adjust at least some of the plurality of receivers. That is, even in the case that the memory device 80 is not connected to the host 90, the memory device 80 itself may perform an operation of reducing input/output characteristics variations among the plurality of receivers, and since the plurality of memory devices included in the single memory package can adjust the receivers, process efficiency may be significantly improved. Accordingly, operating performance and/or efficiency (e.g., functionality) of a memory device and/or an electronic device (e.g., a computing device) in which the memory device is included may be improved.

FIGS. 7, 8, 9, and 10 are views illustrating an operation of a memory device according to some example embodiments of the inventive concepts.

Figure 7:
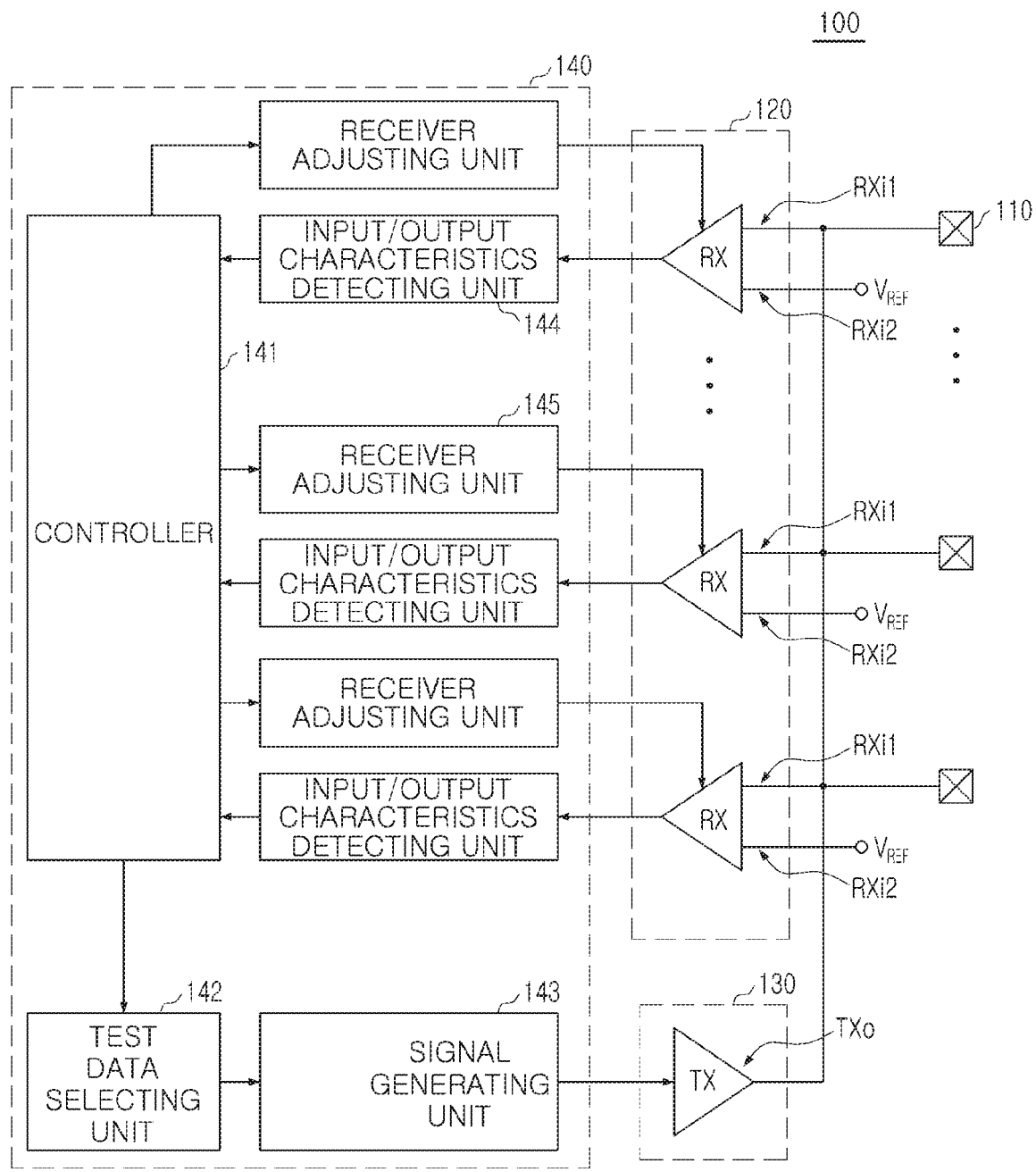
FIGS. 7, 8, 9, and 10 are views illustrating the operation of a memory device according to some example embodiments of the inventive concepts.

Referring to FIG. 7, the memory device 100 may include a plurality of input/output pins 110, a receiving unit 120 including a plurality of receivers RX, a transmitting unit 130 including a transmitter TX, a control logic 140, and the like. In some example embodiments of the inventive concepts, the plurality of input/output pins 110 may be connected to the plurality of receivers RX, respectively. As used herein, an element that is "connected" to another element may be interchangeably referred to as being "coupled" to the other element. Elements that are "coupled" together will be understood to include elements that are "directly connected" to each other (e.g., no intervening elements between the coupled elements) and elements that are "indirectly connected" to each other (e.g., at least one intervening element is between and coupled to each of the coupled elements). Each receiver RX of the plurality of receivers RX may include a first input terminal RXi1 and a second input terminal RXi2, where the second input terminal RXi2 is different from the first input terminal RXi1. The first input terminal RXi1 may be connected to one pin of the plurality of input/output pins 110 and the second input terminal RXi2 may receive a reference voltage $V_{REF}$.

Each of the plurality of receivers RX may compare a signal input to the first input terminal RXi1 with the reference voltage $V_{REF}$ input to the second input terminal RXi2 and send out output data. Restated, each receiver RX may be configured to generate output data using the test signal receiver through the first input terminal RXi1. For example, if the signal input to the first input terminal RXi1 is greater than the reference voltage $V_{REF}$, the output data may have a high logic value, and if the signal input to the first input terminal RXi1 is smaller than the reference voltage $V_{REF}$, the output data may have a low logic value.

The transmitter TX may receive particular (or, alternatively, predetermined) test data and output a test signal. The transmitter TX may output a test signal for adjusting the plurality of receivers RX during a test process of the memory device 100. In some example embodiments of the inventive concepts, the memory device 100 may further include at least one additional transmitter for outputting a signal when the memory device 100 interworks with a host. For example, in some example embodiments the transmitting unit 130 includes a first transmitter TX configured to output the test signal and a second transmitter TX configured to output a signal to an external host that is connected to the plurality of input/output pins 110.

The control logic 140 may control operations of the plurality of receivers RX and the transmitter TX and adjust the plurality of receivers RX during the test process of the memory device 100 to reduce input/output characteristics variations among the plurality of receivers RX. In some example embodiments of the inventive concepts, the input/output characteristics variations may be determined on the basis of the eye margins detected respectively from the plurality of receivers RX. For example, if the variations among the eye margins of the plurality of receivers RX are large, output data generated by the plurality of receivers RX after receiving the same test signal may have different values.

In some example embodiments of the inventive concepts, the control logic 140 may input a particular (or, alternatively, predetermined) test signal to the plurality of receivers RX using the transmitter TX and compare output data sent out by the plurality of receivers with test data corresponding to the test signal. Restated, the control logic 140 may control the transmitter TX to output (e.g., transmit) a particular test signal, such that the plurality of receivers RX receive the particular test signal from the transmitter TX that is coupled to the first input terminals of the plurality of receivers RX. Each receiver RX may generate output data based on receiving the particular test signal from the transmitter TX. The control logic 140 may receive the output data from (e.g., generated by) the plurality of receivers RX and may adjust the plurality of receivers RX using (e.g., based on) the output data generated by the plurality of receivers RX. The control logic 140 may adjust at least one receiver RX of the plurality of receivers RX based on comparing the output data generated by the plurality of receivers RX with the test data. The control logic 140 may regulate at least one of an offset, a voltage gain, a supply voltage, or the reference voltage $V_{REF}$ of each of the plurality of receivers RX using the result of comparing the output data and the test data (e.g., based on at least the output data). The aforementioned offset, voltage gain, supply voltage, and reference voltage with regard to a receiver RX will be understood herein to each be a parameter of the receiver RX. Therefore, it will be understood that the control logic 140 may regulate a parameter of at least one of the receivers RX based on processing output data received at the control logic 140 from the at least one receiver RX that has received the test signal.

The control logic 140 may include a main controller 141, a test data selecting unit 142, a signal generating unit 143, an input/output characteristics detecting unit 144, and a receiver adjusting unit 145. The test data selecting unit 142 may store at least one piece of test data written during the manufacturing process of the memory device 100 and select one piece of test data in response to a command transmitted from the main controller 141. The test data selecting unit 142 may transmit the selected test data to the main controller 141 and the signal generating unit 143. Restated, the test data may include a plurality of pieces of different test data, and the control logic 140 may control the transmitter TX to output a particular test signal based on selecting any one piece of test data of the plurality of pieces of different test data and inputting a signal corresponding to the selected one piece of test data as the particular test signal.

The signal generating unit 143 may convert the test data into a signal that can be transmitted by the transmitter TX, and output the signal. For example, the signal generating unit 143 may generate a particular (or, alternatively, predetermined) input signal using the test data and a particular (or, alternatively, predetermined) clock signal and may transmit the input signal to the transmitter TX. In some example embodiments of the inventive concepts, the transmitter TX may be realized as a pull-up switching element and a pull-down switching element, and the pull-up switching element and the pull-down switching element may be turned on/off to output the test signal. The test signal may be input to the first input terminal of each of the plurality of receivers RX through a signal transmission path within the memory device 100.

Each of the plurality of receivers RX may compare the test signal input to the first input terminal with the reference voltage $V_{REF}$ and send out output data. The output data of the plurality of receivers RX may be determined as a high logic value or a low logic value by comparing the test signal with the reference voltage $V_{REF}$ at a rising edge and/or a falling edge of the clock signal. In some example embodiments of the inventive concepts, eye margins representing input/output characteristics of each of the plurality of receivers RX may differ from each other due to variations among the plurality of receivers RX. Therefore, the values of the output data generated by comparing the test signal with the reference voltage $V_{REF}$ at the rising edge or the falling edge of the clock signal may differ in at least some of the plurality of receivers RX.

The input/output characteristics detecting unit 144 may detect the input/output characteristics of each receiver RX of the plurality of receivers RX using (e.g., based on) the output data of each receiver RX (e.g., the output data generated by each receiver RX) of the plurality of receivers RX. For example, the input/output characteristics detecting unit 144 may compare the output data of a plurality of receivers RX with the test data and transmit the result to the main controller 141. The main controller 141 may generate a command for adjusting at least some of the plurality of receivers RX on the basis of the result of comparing the output data and the test data, and transmit the command to the receiver adjusting unit 145. Restated, for example, the control logic 140 may adjust a first receiver RX of the plurality of receivers RX using output data generated by the first receiver RX and may further adjust a second receiver RX of the plurality of receivers RX using input/output characteristics of the first receiver RX and output data generated by the second receiver RX. The receiver adjusting unit 145 may thus be configured to adjust at least one receiver RX of the plurality of receivers RX based on the input/output characteristics detected by the input/output characteristics detecting unit 144.

For example, if the test data has a high logic value and the output data has a low logic value, the main controller 141 may increase the offset value of the receiver RX or reduce the reference voltage $V_{REF}$ input to the second input terminal of the receiver RX. In some example embodiments, the main controller 141 may adjust the receiver to have the same logic value so that the output data may have the same logic value as that of the test data by regulating a slew rate of the first input terminal of the receiver RX.

On the other hand, if the test data has a low logic value while the output data has a high logic value, the main controller 141 may adjust the receiver RX such that the output data is output with the same low logic value as that of the test data, by reducing the offset value of the receiver RX or increasing the reference value $V_{REF}$. In some example embodiments, the main controller 141 may regulate the slew rate of the first input terminal so that the output data of the receiver RX matches the test data.

That is, according to some example embodiments of the inventive concepts, the memory device 100 itself may adjust the plurality of receivers RX using the test signal, without having to communicate with the host through the plurality of input/output pins 110. Thus, during the test process of the memory package including the plurality of memory devices 100, operations of adjusting the plurality of receivers RX may be performed at the same time, significantly improving efficiency of the test process. Restated, in some example embodiments the control logic 140 is configured to simultaneously adjust at least two receivers RX of the plurality of receivers RX. Accordingly, operating performance and/or efficiency (e.g., functionality) of a memory device and/or an electronic device (e.g., a computing device) in which the memory device is included may be improved.

Figure 8:
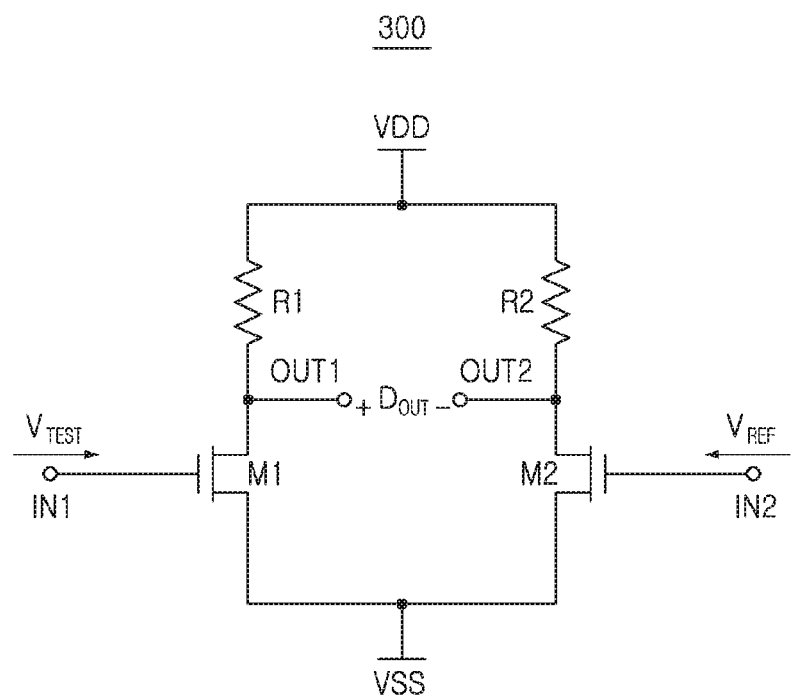

FIG. 8 is a circuit diagram schematically illustrating a receiver 300 that may be included in a memory device according to some example embodiments of the inventive concepts. Referring to FIG. 8, the receiver 300 may include a first switching element M1 providing a first input terminal IN1 and a first output terminal OUT1, a second switching element M2 providing a second input terminal IN2 and a second output terminal OUT2, and resistor elements R1 and R2. Drain terminals of the first and second switching elements M1 and M2 may be connected to a first supply voltage VDD through the resistor elements R1 and R2 and source terminals of the first and second switching elements M1 and M2 may be connected to a second supply voltage VSS. The first supply voltage VDD may have a magnitude greater than the second supply voltage VSS. Output data $D_{OUT}$ may be determined by a difference between a voltage of the first output terminal OUT1 and the second output terminal OUT2. The receiver 300 may operate as a type of differential amplifier.

In some example embodiments of the inventive concepts, a test signal $V_{TEST}$ may be input to the first input terminal IN1 and the reference voltage $V_{REF}$ may be input to the second input terminal IN2. The memory device may include a plurality of receivers 300, and, in an ideal case, the first switching element M1 and the second switching element M1 included in the receiver 300 may have the same characteristics. Accordingly, the output data $D_{OUT}$ may have the same logic value as that of the test data.

However, due to variations that occur during the manufacturing process, the first switching element M1 and the second switching element M2 included in the receiver 300 may have different characteristics. Thus, due to the difference between the first switching element M1 and the second switching element M2 included in each receiver 300, eye margins of signals detected from the respective receivers 300 may differ from each other. This will be described in detail with reference to FIGS. 9 and 10 hereinafter.

Figure 9:
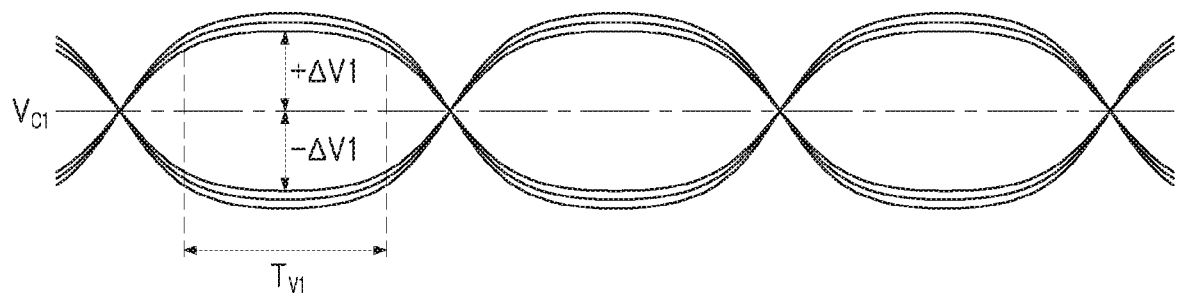
Figure 10:
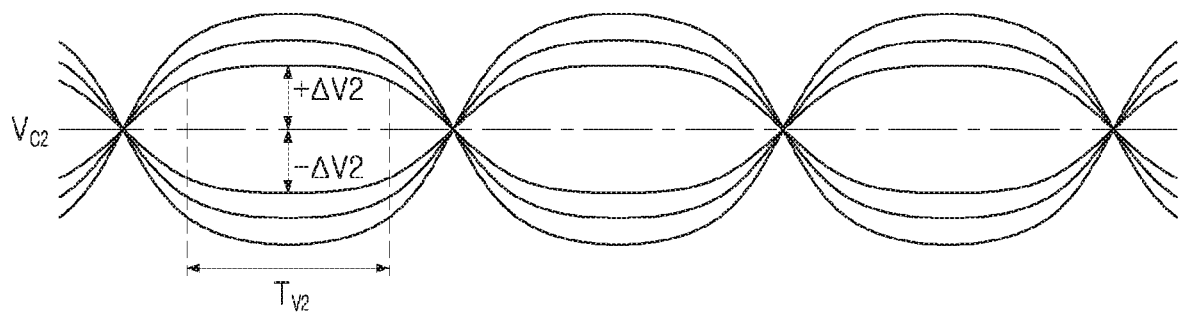

FIGS. 9 and 10 are graphs illustrating eye margins of signals detected at the first output terminal OUT1 of the receiver 300 according to some example embodiments, including the example embodiments illustrated in FIG. 8. In the graphs illustrated in FIGS. 9 and 10, eye margins may be different from each other due to the difference in the characteristics of the first switching element M1 included in the receiver 300.

First, an output signal according to some example embodiments of the inventive concepts illustrated in FIG. 9 may have deviations of $\pm \Delta V1$ with respect to a first intermediate voltage $V_{C1}$, and a first validity period $T_{V1}$ in which the receiver 300 may generate valid output data $D_{OUT}$ may be defined. When a rising edge or a falling edge of a clock signal that determines an operation timing of the receiver 300 is present in the first validity period $T_{V1}$, the receiver 300 may accurately generate output data.

Meanwhile, an output signal according to some example embodiments of the inventive concepts illustrated in FIG. 10 may have deviations of $\pm \Delta V2$ with respect to a second intermediate voltage $V_{C2}$. Referring to FIG. 10, a second validity period $T_{V2}$ in which the receiver 300 may generate valid output data $D_{OUT}$ using an output signal may be defined. In some example embodiments of the inventive concepts, the second validity period $T_{V2}$ may be shorter than the first validity period $T_{V1}$ and the deviations$\pm \Delta V2$ may be less than the deviations$\pm \Delta V1$. Thus, the output signal according to some example embodiments, including the example embodiments illustrated in FIG. 10 may have a relatively small eye mask as compared with the output signal according to some example embodiments, including the example embodiments illustrated in FIG. 9.

As described above with reference to FIGS. 8 to 10, even in the case that the receivers 300 having the same structure receive the same test signal $V_{TEST}$ through the first input terminal IN1, eye margins of the output signals detected at the first output terminal OUT1 may be different due to variations generated during the manufacturing process. The memory device according to some example embodiments of the present inventive concepts may compare the test data used to generate the test signal $V_{TEST}$ with the output data $D_{OUT}$ of the receiver 300, and regulate an offset voltage of the receiver 300, the reference voltage $V_{REF}$ input to the receiver 300 on the basis of the comparison result. In some example embodiments, test signal $V_{TEST}$ input to the receiver 300 may be a signal output from the transmitter included in the memory device. Thus, the differences between the receivers 300 made due to variations in terms of manufacturing process may be adjusted by the memory device itself.

Figure 11:
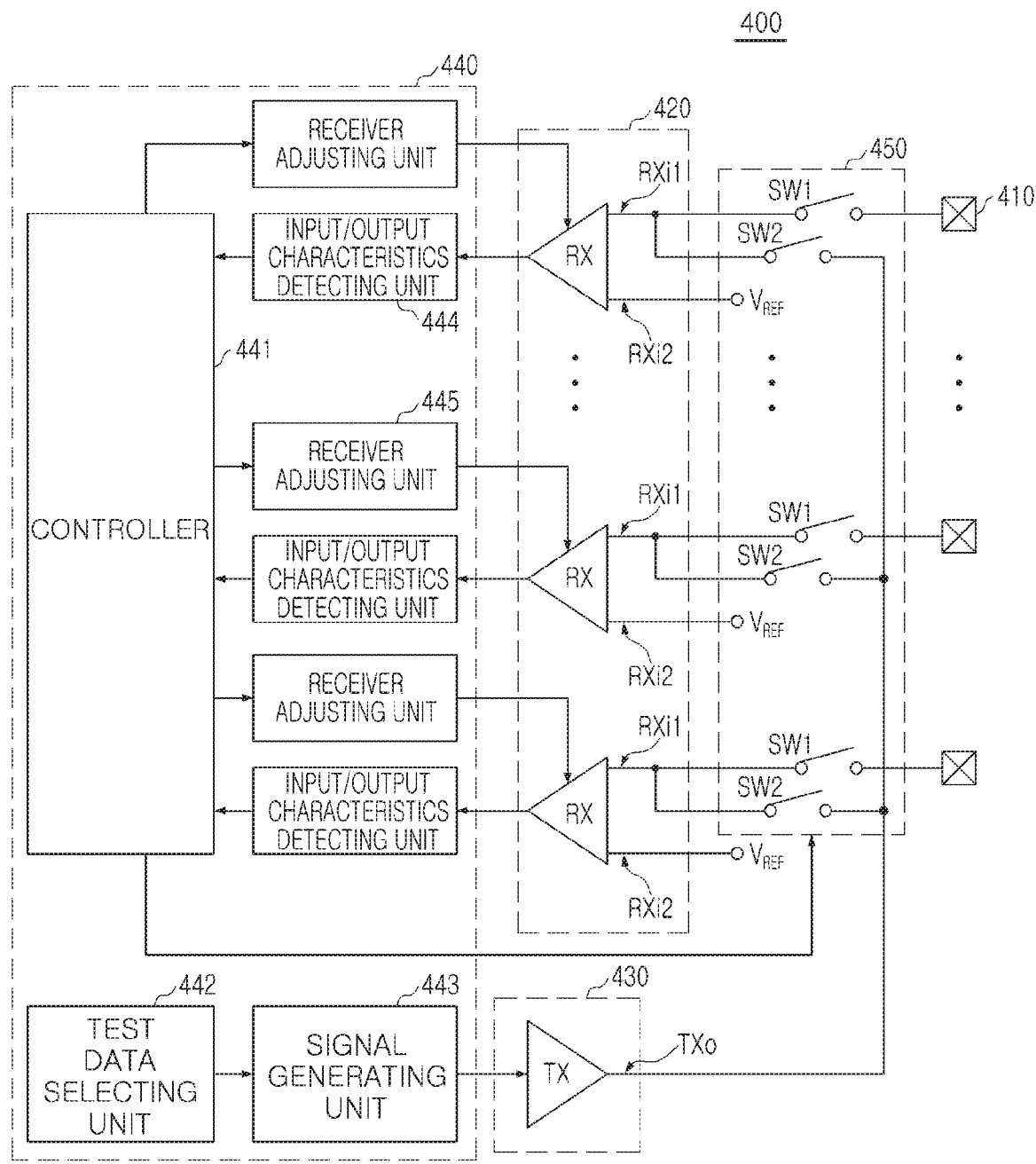
FIG. 11 is a view illustrating an operation of a memory device according to some example embodiments of the inventive concepts.

FIG. 11 is a view illustrating an operation of a memory device according to some example embodiments of the inventive concepts.

Referring to FIG. 11, a memory device 400 according to some example embodiments of the inventive concepts may include a plurality of input/output pins 410, a receiving unit 420 including a plurality of receivers RX, a transmitting unit 430 including a transmitter TX, a control logic 440, a switching unit 450, and the like. Operations of the plurality of input/output pins 410, the plurality of receivers RX, the transmitter TX, and the control logic 440 may be similar to those described above with reference to FIG. 7. Furthermore, elements shown in FIG. 11 having similar reference labels as elements shown in FIG. 7 will be understood to be the same as the elements described with reference to FIG. 7 and thus a description of such elements is not repeated here.

The memory device 400 according to some example embodiments of the inventive concepts illustrated in FIG. 11 may include the switching unit 450 including a first switching element SW1 and a second switching element SW2. The first switching element SW1 may be connected between the first input terminal RXi1 of each of the plurality of receivers RX and the input/output pins 410. Meanwhile, the second switching element SW2 may be connected (e.g., coupled) between the first input terminal RXi1 of each of the plurality of receivers RX and an output terminal TXo of the transmitter TX. Restated, the memory device 400 may include a plurality of switching elements SW1 connected between separate, respective first input terminals RXi1 of the plurality of receivers RX and corresponding separate, respective input/output pins 410 of the plurality of input/output pins 410. The first input terminals RXi1 of the receivers RX may be coupled to separate, respective input/output pins 410 and the output terminal TXo of the transmitter TX.

The first switching element SW1 may be connected between the first input terminal of each of the plurality of receivers RX and the input/output pins 410. The memory package may include a plurality of memory devices 400 such as illustrated in FIG. 11, and the memory devices included in the memory package may commonly use the input/output pins 410 with each other. While other memory devices included in the memory package, together with the memory device 400, performs an adjustment operation on the receivers, the first switching element SW1 may be turned off to minimize an influence of the receiver adjustment operation of other memory devices on the memory device 400. Restated, the control logic 440 may be configured to select at least one receiver RX of the plurality of receivers RX to be adjusted based on controlling ON/OFF of (e.g., selectively opening or closing) each first switching element SW1 of the plurality of first switching elements SW1.

The control logic 440 may sequentially adjust the plurality of receivers RX, while sequentially turning on the second switching elements SW2 connected between each of the plurality of receivers RX and the transmitter TX. That is, in a state in which only the second switching element SW2 connected to any one of the plurality of receivers RX is turned on and all the other remaining second switching elements SW2 are turned off, the control logic 440 may adjust the receiver RX connected to the turned-on second switching element SW2.

In this manner, the control logic 440 may individually adjust each of the plurality of receivers RX and minimize interference that may occur between the plurality of receivers RX. In some example embodiments of the inventive concepts, the control logic 440 may adjust other receivers RX with reference to the offset, supply voltage, voltage gain, reference voltage $V_{REF}$, and the like, of the already adjusted receiver RX.

Figure 12:
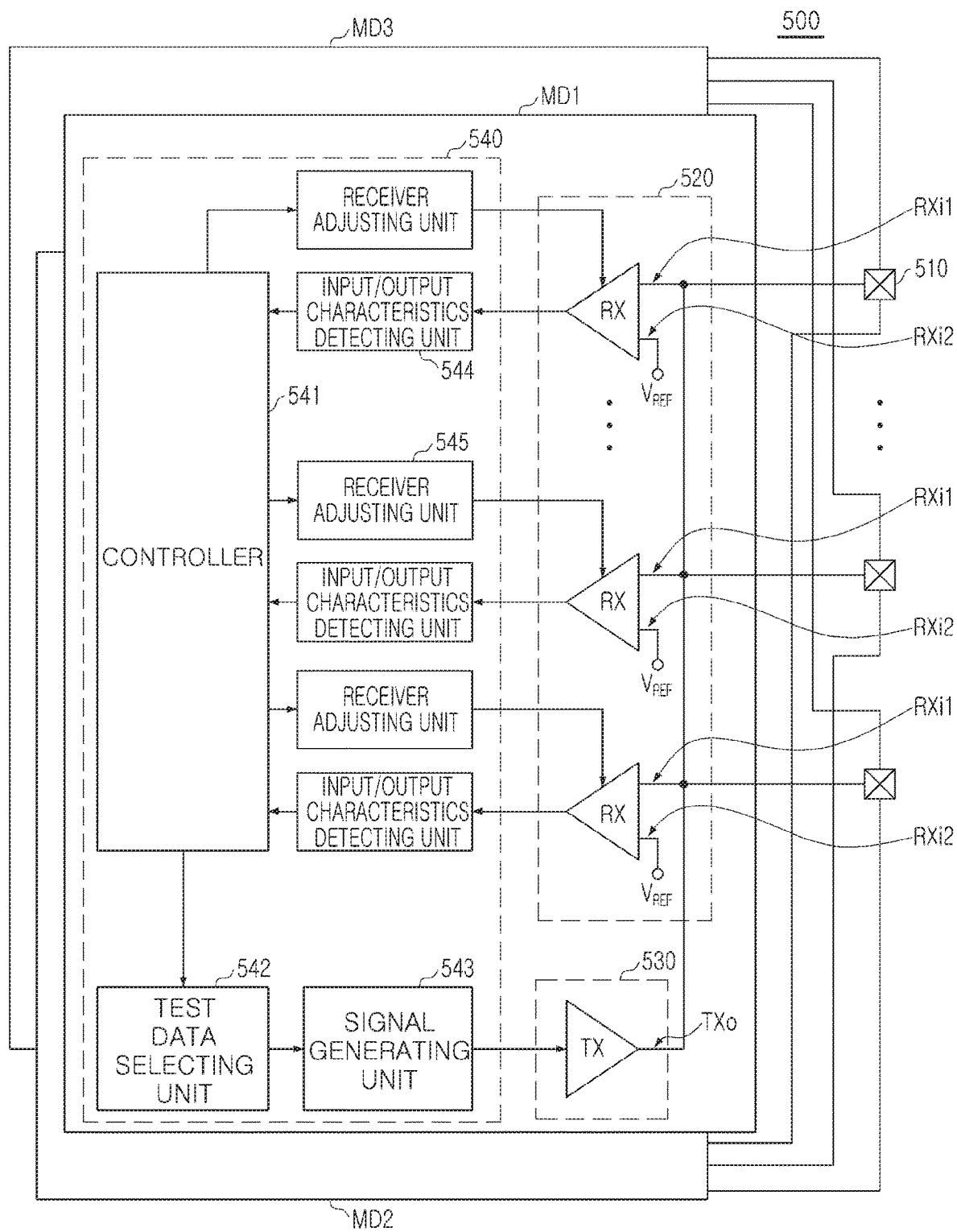
FIGS. 12, 13, and 14 are views illustrating an operation of a memory package according to some example embodiments of the inventive concepts.
Figure 13:
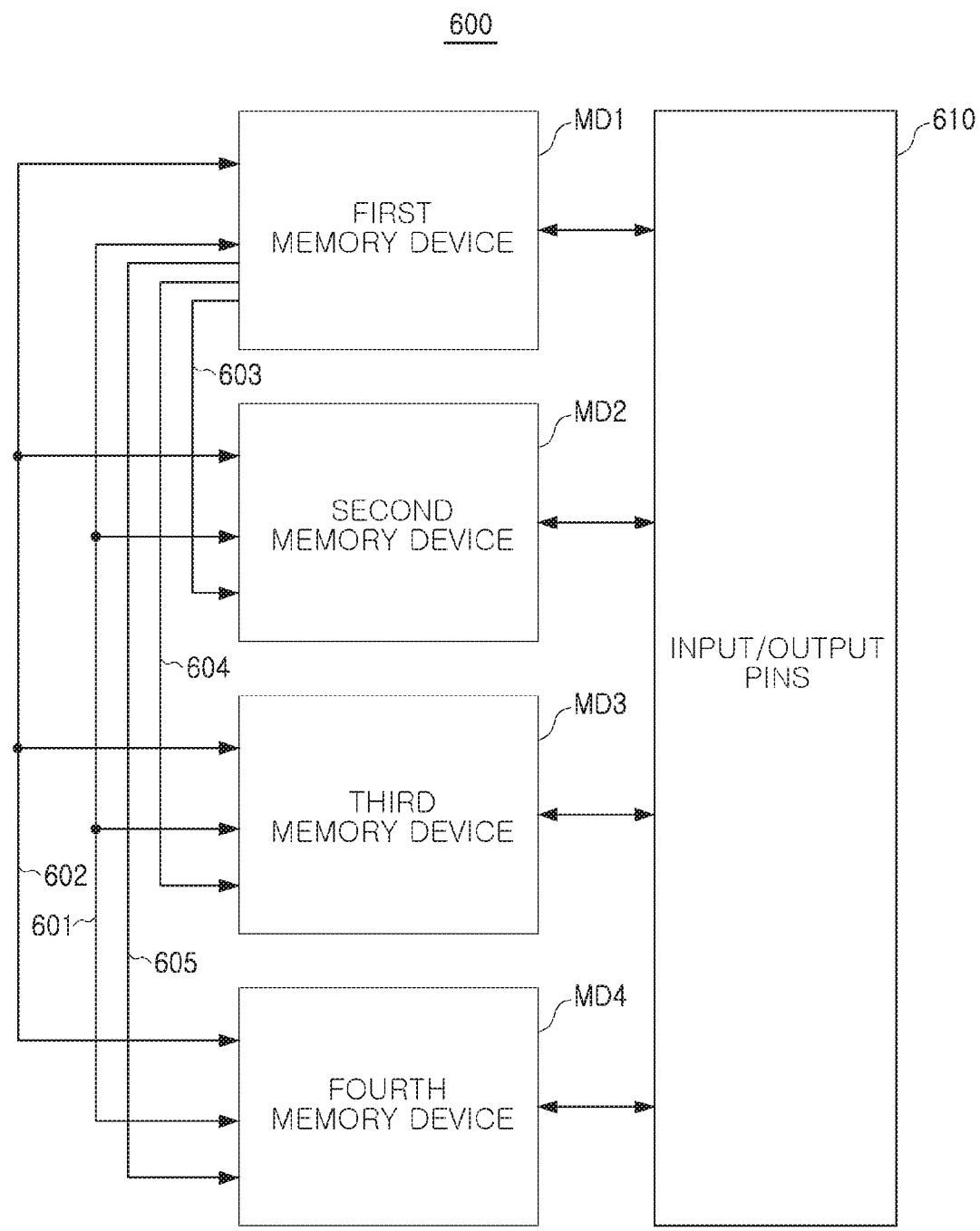
Figure 14:
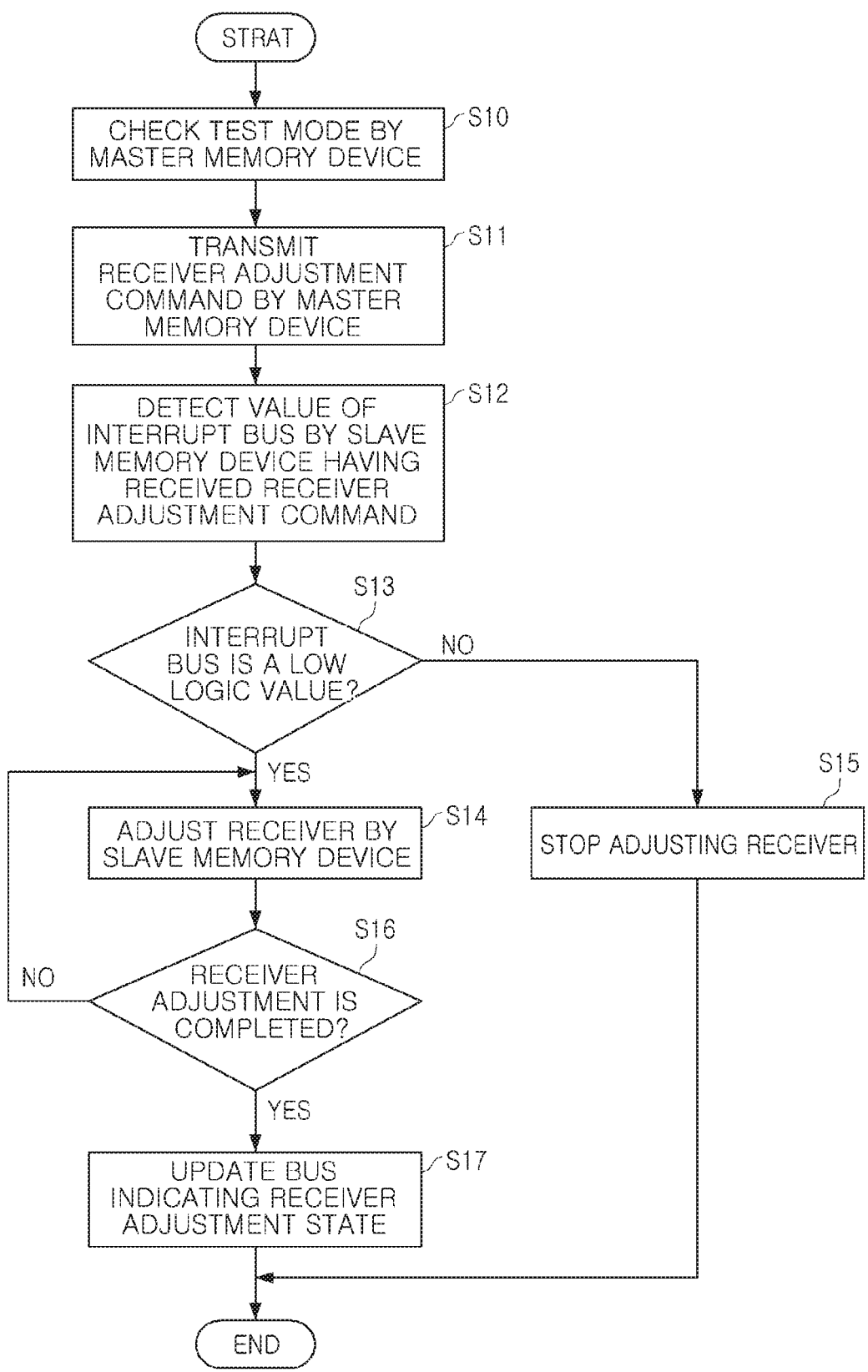

FIGS. 12, 13, and 14 are views illustrating an operation of a memory package according to some example embodiments of the inventive concepts. Elements shown in FIG. 12, FIG. 13, and FIG. 14 having similar reference labels as elements shown in FIG. 7 will be understood to be the same as the elements described with reference to FIG. 7 and thus a description of such elements is not repeated here.

First, referring to FIG. 12, a memory package 500 according to some example embodiments of the inventive concepts may include a plurality of memory devices MD1 to MD3. The plurality of memory devices MD1 to MD3 may operate in a master/slave manner and may have similar structures. Hereinafter, for the purposes of description, it is assumed that the first memory device MD1 operates as a master memory device (e.g., may be a master memory device) and the second and third memory devices MD2 and MD3 operate as slave memory devices (e.g., may be slave memory devices), where the master memory device MD1 and the plurality of slave memory devices MD2 and MD3 share the input/output pins 510.

The first memory device MD1 may include a receiving unit 520 including a plurality of receivers RX, a transmitting unit 530 including a transmitter TX, and a control logic 540. Each of the plurality of receivers RX may include a first input terminal connected to one of the plurality of input/output pins 510. Operations of the plurality of receivers RX, the transmitter TX, and the control logic 540 may be similar to those described above with reference to FIGS. 7 and 11.

In some example embodiments, including the example embodiments illustrated in FIG. 12, the plurality of memory devices MD1 to MD3 may commonly use input/output pins 510. Thus, while the first memory device MD1 is detecting margins of the plurality of receivers RX of the receiving unit 520 and adjusting the plurality of receivers RX, the other memory devices MD2, MD3 may be affected.

In order to solve this problem, in some example embodiments of the inventive concepts, the first memory device MD1 operating as a master memory device may control operations of the other memory devices MD2 and MD3. For example, while the first memory device MD1 is adjusting the plurality of receivers RX during a test process, the other memory devices MD2 and MD3 may wait without adjusting a receiver. After completing adjustment on the plurality of receivers RX, the first memory device MD1 may control any one of the other memory devices MD2 and MD3 to adjust receivers.

Referring to FIG. 13, a memory package 600 according to some example embodiments of the inventive concepts may include input/output pins 610 and a plurality of memory devices MD1, MD2, MD3, and MD4. Similar to the case of FIG. 12 described above, the plurality of memory devices MD1 to MD4 sharing the input/output pins 610 may operate in a master/slave manner. Hereinafter, for the purposes of description, it is assumed that the first memory device MD1 operates as a master memory device and the second to fourth memory devices MD2-MD4 operate as slave memory devices.

The plurality of memory devices MD1 to MD4 may sequentially adjust receivers by themselves under the control of the first memory device MD1 set as a master memory device. Since the plurality of memory devices MD1 to MD4 commonly use the input/output pins 610, if two or more of the plurality of memory devices MD1 to MD4 simultaneously adjust the receivers, interference may occur and the receivers may not be accurately adjusted. In order to solve this problem, the plurality of memory devices MD2 to MD4 may sequentially adjust the receivers under the control of the first memory device MD1. The first memory device MD1, set as a master memory device, may control the memory devices MD1 to MD4 to sequentially regulate a parameter (e.g., offset, voltage gain, supply voltage, reference voltage, some combination thereof, or the like) of the receivers RX of the memory devices MD1 to MD4.

The first memory device MD1 may communicate with the second to fourth memory devices MD2 to MD4 via a plurality of data buses 601, 602, 603, 604, and 605. For example, the first data bus 601 may be a bus indicating whether the receivers respectively included in the plurality of memory devices MD1 to MD4 are adjusted. The second data bus 602 may be an interrupt bus. Meanwhile, the third to fifth data buses 603 to 605 may be buses for the first memory device MD1 to transmit a control command to each of the other memory devices MD2 to MD4.

In some example embodiments of the inventive concepts, the first memory device MD1 may control any one of the second to fourth memory devices MD2 to MD4 to adjust reception through the third to fifth data buses 603 to 605. When the first memory device MD1 transfers a receiver adjustment command to the second memory device MD2 via the third data bus 603, the second memory device MD2 may determine whether the second data bus 602, an interrupt bus, has a logic value and subsequently start adjustment of the receivers. In some example embodiments of the inventive concepts, when the second data bus 602 has a high logic value, the second memory device MD2 may not adjust the receivers even in the case that the receiver adjustment command is received.

Meanwhile, while adjusting the receivers, the second memory device MD2 may maintain the first data bus 601 at a logic low value. The first memory device MD1 may determine whether the receiver adjustment of the second memory device MD2 has been completed with reference to a logic value of the first data bus 601.

When the receiver adjustment of the second memory device MD2 is completed, the second memory device MD2 may change the first data bus 601 to a high logic value. As the first data bus 601 is changed to the high logic value, the first memory device MD1 may determine that the receiver adjustment of the second memory device MD2 has been completed and control any one of the other memory devices MD3 and MD4 to adjust receivers. An operation of the memory package 600 will be described in more detail with reference to FIG. 14 hereinafter.

FIG. 14 is a flowchart provided to illustrate an operation of a memory package according to some example embodiments of the inventive concepts. Hereinafter, for the purposes of description, it is assumed that the first memory device MD1 is a master memory device and the second to fourth memory devices MD2 to MD4 are slave memory devices, as in the case of FIG. 13 described above.

Referring to FIG. 14, an operation of the memory device according to some example embodiments of the inventive concepts may start by the first memory device MD1 checking the test mode in operation S10. The test mode may be a mode for carrying out a type of verification procedure after the memory package 600 is manufactured. In some example embodiments of the inventive concepts, the first memory device MD1 may enter the test mode when the second data bus 602, an interrupt bus, has a low logic value.

The first memory device MD1 may generate a receiver adjustment command and transmit the receiver adjustment command to any one of the second to fourth memory devices MD2 to MD4, slave memory devices, in operation S11. For the purposes of description, it is assumed that the second memory device MD2 receives the receiver adjustment command.

The second memory device MD2 may detect a value of the second data bus 602, an interrupt bus, in operation S12, and determine whether the value of the second data bus 602 is a low logic value in operation S13. If it is determined that the value of the second data bus 602 is a low logic value in operation S13, the second memory device MD2 may adjust the receivers by regulating at least one of parameters such as an offset, a supply voltage, a voltage gain, and the like, of each of the receivers in operation S14. Meanwhile, if it is determined that the value of the second data bus 602 is a high logic value in operation S13, the second memory device MD2 may stop the receiver adjustment in operation S15.

The second memory device MD2 may determine whether the receiver adjustment is completed in operation S16. The second memory device MD2 may simultaneously or sequentially adjust the plurality of receivers. When the adjustment of the plurality of receivers is completed, the second memory device MD2 may update the value of the first data bus 601, a bus indicating a receiver adjustment state, in operation S17. For example, after completing the receiver adjustment, the second memory device MD2 may set the value of the first data bus 601 to a high logic value, thus informing the first memory device MD1, the master memory device, that the receiver adjustment has been completed.

Figure 15:
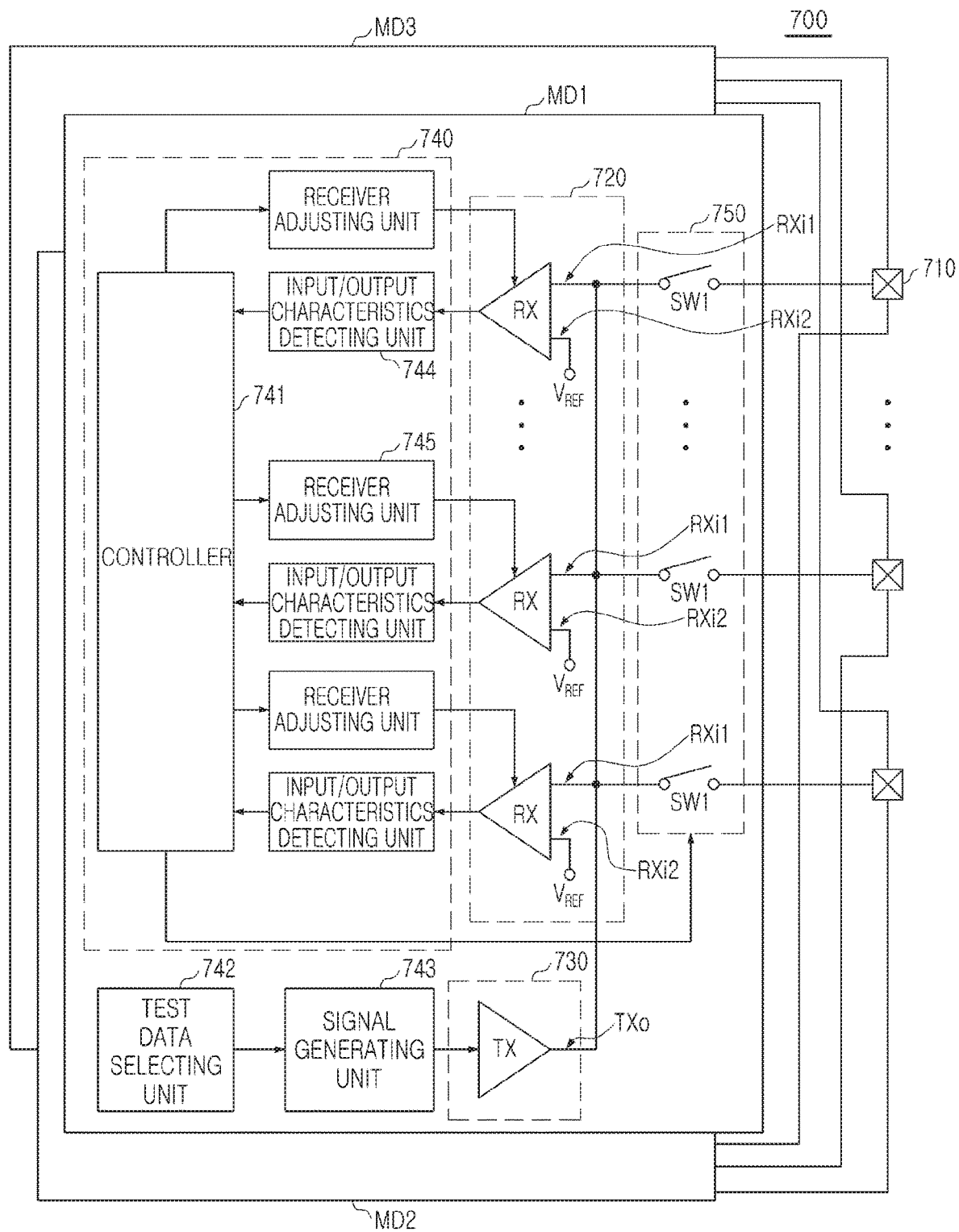
FIG. 15 is a view illustrating an operation of a memory package according to some example embodiments of the inventive concepts.

FIG. 15 is a view provided to illustrate an operation of a memory package according to some example embodiments of the inventive concepts.

Referring to FIG. 15, a memory package 700 according to some example embodiments of the inventive concepts may include a plurality of memory devices MD1 to MD3. The plurality of memory devices MD1 to MD3 may have similar structures to each other. The first memory device MD1 may include a plurality of receivers RX respectively having first input terminals connected to a plurality of input/output pins 710, a transmitter TX for outputting a test signal, a control logic 740, and the like. The plurality of receivers RX may be included in a receiver 720 and a transmitter TX may be included in a transmitter 730. Operations of the plurality of receivers RX, the transmitter TX, and the control logic 740 may be similar to those described above with reference to FIGS. 7, 11, and 12. Elements shown in FIG. 15 having similar reference labels as elements shown in at least FIG. 7 will be understood to be the same as the elements described with reference to FIG. 7 and thus a description of such elements is not repeated here.

Each of the memory devices MD1 to MD3 included in the memory package 700 according to some example embodiments of the inventive concepts illustrated in FIG. 15 may include a switching unit 750. The switching unit 750 may include first switching elements SW1 connected between first input terminals of the plurality of receivers RX and the plurality of input/output pins 710.

In some example embodiments of the inventive concepts, in a test mode for regulating an offset of each of the plurality of receivers RX, and the like, the first switching element SW1 included in the plurality of memory devices MD1 to MD3 may all be turned off. By turning off all the first switching elements SW1 included in the plurality of memory devices MD1 to MD3, interference that may occur as the receivers RX included in each of the plurality of memory devices MD1 to MD3 commonly use the input/ output pins 710 may be removed. Therefore, in the memory package 700 according to some example embodiments, including the example embodiments illustrated in FIG. 15, each of the plurality of memory devices MD1 to MD3 may simultaneously adjust the receivers RX, increasing efficiency of the test process. For example, the memory devices MD1 to MD3 may simultaneously adjust a parameter (e.g., offset, voltage gain, supply voltage, reference voltage, some combination thereof, or the like) of the receivers RX of the memory devices MD1 to MD3. Accordingly, operating performance and/or efficiency (e.g., functionality) of a memory device and/or an electronic device (e.g., a computing device) in which the memory device is included may be improved.

Figure 16:
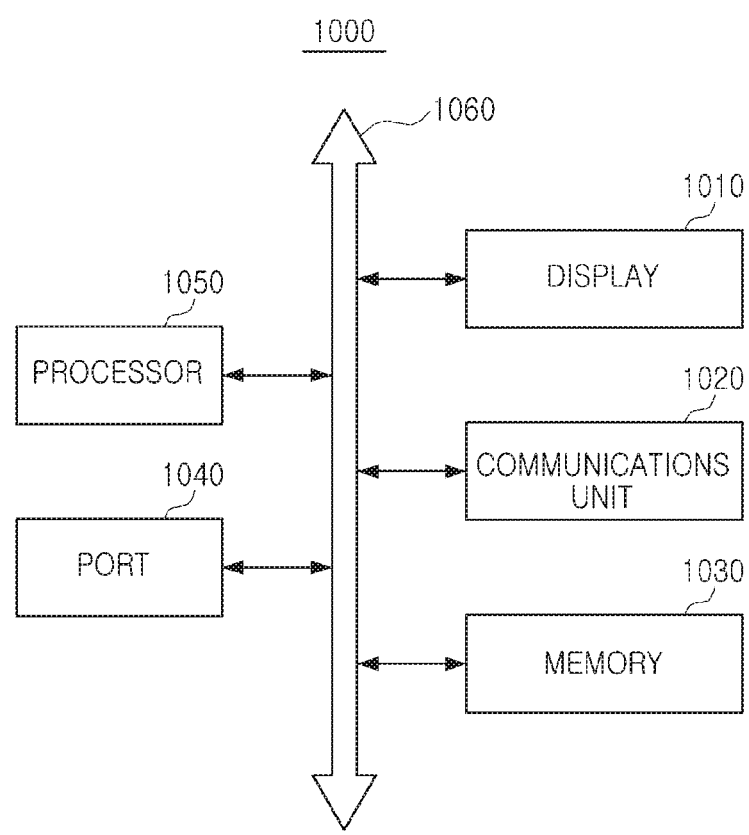
FIG. 16 is a view schematically illustrating an electronic device including a memory device according to some example embodiments of the inventive concepts.

FIG. 16 is a view schematically illustrating an electronic device including a memory device according to some example embodiments of the inventive concepts.

An electronic device 1000 according to some example embodiments, including the example embodiments illustrated in FIG. 16 may include a display 1010, a communications unit 1020, a memory 1030, a port 1040, a processor 1050, and the like. The components such as the display 1010, the communications unit 1020, the memory 1030, the port 1040, the processor 1050, and the like, may communicate with each other via a bus 1060. In addition to the above-described components, the electronic device 1000 may further include a power supply device, a sensor device, various input/output devices, and the like.

The processor 1050 may perform a specific operation, instruction, task and the like. The processor 1050 may be a central processing unit (CPU), a microprocessor unit (MCU), an application processor (AP), or the like, and may communicate with other components such as the display 1010, the communications unit 1020, the memory 1030, the port 1040, and the like.

In some example embodiments, including the example embodiments illustrated in FIG. 16, the memory 1030 may be provided as a single memory device or in the form of a memory package including a plurality of memory devices. The memory 1030 may follow various example embodiments of the present inventive concepts described above with reference to FIGS. 1 through 15.

According to some example embodiments of the inventive concepts, the memory device itself may adjust a plurality of receivers using test data written to the memory device during a manufacturing process, without interworking with a host. By adjusting the plurality of receivers, input/output characteristics of the memory device may be optimized. In some example embodiments, in case in which a plurality of memory devices are included in a single memory package, the plurality of memory devices may simultaneously adjust receivers as there may be no need to interwork with a host. As a result, productivity of the manufacturing process of the memory devices may be improved. Accordingly, efficiency of manufacturing improved-quality memory devices may be improved, thereby resulting in providing memory devices and/or electronic device (e.g., computing devices) including same that have improved operating performance and/or efficiency (e.g., functionality).

Various and advantageous advantages and effects of the present inventive concepts are not limited to those described above and may be more easily understood in the course of describing the specific example embodiments of the present inventive concepts.

While example embodiments have been shown and described above, it will be apparent to those skilled in the art that modifications and variations could be made without departing from the scope of the present inventive concepts as defined by the appended claims.

What is claimed is:

1. A memory device, comprising:
a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor;
a plurality of receivers, each receiver of the plurality of receivers includes a first input terminal coupled to one pin of a plurality of input/output pins;
a transmitter having an output terminal coupled to the first input terminals of the plurality of receivers; and
a control circuit configured to
control the transmitter to output a particular test signal,
wherein the plurality of receivers are each configured to generate output data based on receiving the particular test signal from the transmitter,
wherein the control circuit is further configured to adjust the plurality of receivers based on the output data generated by the plurality of receivers and received at the control circuit from the plurality of receivers.

2. The memory device of claim 1, wherein
the particular test signal is generated based on particular test data.

3. The memory device of claim 2, wherein
the control circuit is configured to adjust at least one receiver of the plurality of receivers based on comparing the output data generated by the plurality of receivers with the particular test data.

4. The memory device of claim 2, wherein
the particular test data includes a plurality of pieces of different test data, and
the control circuit is configured to control the transmitter to output the particular test signal based on
selecting any one piece of test data of the plurality of pieces of different test data, and
inputting a signal corresponding to the selected one piece of test data as the particular test signal.

5. The memory device of claim 1, wherein
the control circuit is configured to regulate at least one of
an offset of each receiver of the plurality of receivers,
a voltage gain of each receiver of the plurality of receivers,
a supply voltage of each receiver of the plurality of receivers, or
a reference voltage that is input to each receiver of the plurality of receivers.

6. The memory device of claim 5, wherein
each of the plurality of receivers includes a second input terminal configured to receive the reference voltage, and the second input terminal is different from the first input terminal.

7. The memory device of claim 5, wherein
the plurality of receivers are synchronized with a clock signal to generate the output data based on comparing the particular test signal with the reference voltage.

8. The memory device of claim 1, wherein
the plurality of receivers include a first receiver and a second receiver, and the control circuit is configured to
adjust the first receiver based on output data generated by the first receiver, and
adjust the second receiver based on input/output characteristics of the first receiver and output data generated by the second receiver.

9. The memory device of claim 1, further comprising:
a plurality of switching elements coupled between separate, respective first input terminals of the plurality of receivers and corresponding separate, respective input/output pins of the plurality of input/output pins.

10. The memory device of claim 9, wherein
the control circuit is configured to select at least one receiver to be adjusted, from among the plurality of receivers, based on selectively opening or closing each switching element of the plurality of switching elements.

11. The memory device of claim 1, wherein
the transmitter includes a first transmitter configured to output the particular test signal and a second transmitter configured to output a signal to an external host coupled to the plurality of input/output pins.

12. The memory device of claim 1, wherein
the control circuit is configured to simultaneously adjust at least two receivers of the plurality of receivers.

13. The memory device of claim 1, wherein
the control circuit is configured to sequentially adjust the plurality of receivers.

14. The memory device of claim 1, wherein
the control circuit includes
an input/output characteristics detecting unit configured to detect input/output characteristics of each receiver of the plurality of receivers based on output data generated by each receiver of the plurality of receivers; and
a receiver adjusting unit configured to adjust at least one receiver of the plurality of receivers based on the input/output characteristics.

15. A memory device, comprising:
a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor;
a transmitter configured to output a particular test signal;
a receiver including
a first input terminal coupled to an input/output pin and an output terminal of the transmitter, and
a second input terminal configured to receive a reference voltage
wherein the receiver is configured to generate output data based on the particular test signal received through the first input terminal; and
a control circuit configured to regulate an offset of the receiver based on the output data.

16. A memory package comprising:
a package substrate having a plurality of input/output pins; and
a plurality of memory devices on the package substrate, the plurality of memory devices configured to share the plurality of input/output pins, each memory device of the plurality of memory devices including
a plurality of memory banks, each of the plurality of memory banks includes a bank array having a plurality of memory cells, a row decoder selecting at least one of word lines connecting to the plurality of memory cells, and a column decoder selecting at least one of bit lines connecting to the plurality of memory cells, and each of the plurality of memory cells includes a capacitor and a transistor;
a plurality of receivers coupled to the plurality of input/output pins,
a transmitter configured to output a particular test signal to at least one receiver of the plurality of receivers, and
a control circuit configured to regulate a parameter of the at least one receiver, based on output data generated by the at least one receiver at the control circuit, the output data generated by the at least one receiver based on the at least one receiver having received the particular test signal.

17. The memory package of claim 16, wherein
the plurality of memory devices include a master memory device and a plurality of slave memory devices, the master memory device and the plurality of slave memory devices sharing the plurality of input/output pins.

18. The memory package of claim 17, wherein
the master memory device is configured to control the plurality of memory devices to sequentially regulate a parameter of the pluralities of receivers of the plurality of memory devices.

19. The memory package of claim 16, wherein
the plurality of memory devices are configured to simultaneously adjust a parameter of the pluralities of receivers of the plurality of memory devices.

20. The memory package of claim 16, wherein
the plurality of memory devices are stacked on the package substrate.

* * * * *